United States Patent
Brabec et al.

(10) Patent No.: US 8,129,616 B2
(45) Date of Patent: Mar. 6, 2012

(54) ROLL TO ROLL MANUFACTURING OF ORGANIC SOLAR MODULES

(75) Inventors: Christoph Brabec, Linz (AT); Jens Hauch, Heroldsberg (DE)

(73) Assignee: Konarka Technologies, Inc., Lowell, MA (US)

( * ) Notice: Subject to any disclaimer, the term of this patent is extended or adjusted under 35 U.S.C. 154(b) by 396 days.

(21) Appl. No.: 11/780,951

(22) Filed: Jul. 20, 2007

(65) Prior Publication Data

US 2007/0295400 A1 Dec. 27, 2007

Related U.S. Application Data

(62) Division of application No. 11/127,439, filed on May 11, 2005, now Pat. No. 7,476,278.

(30) Foreign Application Priority Data

May 14, 2004 (DE) .......................... 10 2004 024 461

(51) Int. Cl.
H01L 31/00 (2006.01)
(52) U.S. Cl. ........................................ 136/263
(58) Field of Classification Search .................... 136/263
See application file for complete search history.

(56) References Cited

U.S. PATENT DOCUMENTS

| | | | |
|---|---|---|---|
| 4,586,980 A | 5/1986 | Hirai et al. | |
| 4,606,931 A * | 8/1986 | Olsen et al. ...................... | 216/40 |
| 4,951,602 A | 8/1990 | Kanai | |
| 5,296,036 A | 3/1994 | Matsuyama et al. | |
| 5,571,749 A | 11/1996 | Matsuda et al. | |
| 5,589,007 A | 12/1996 | Fujioka et al. | |
| 6,228,228 B1 | 5/2001 | Singh et al. | |
| 6,315,820 B1 * | 11/2001 | Saloka et al. ...................... | 96/11 |
| 6,323,056 B1 * | 11/2001 | Miyoshi ........................... | 438/80 |
| 6,372,538 B1 | 4/2002 | Wendt et al. | |
| 6,555,284 B1 | 4/2003 | Boroson et al. | |
| 6,579,422 B1 | 6/2003 | Kakinuma | |
| 6,946,597 B2 * | 9/2005 | Sager et al. .................... | 136/263 |
| 6,967,115 B1 * | 11/2005 | Sheats ............................. | 438/22 |
| 7,122,398 B1 | 10/2006 | Pichler | |
| 7,247,346 B1 | 7/2007 | Sager et al. | |
| 2002/0020496 A1 | 2/2002 | Shinohara et al. | |
| 2002/0149572 A1 | 10/2002 | Schulz et al. | |
| 2002/0195928 A1 | 12/2002 | Grace et al. | |
| 2003/0189403 A1 | 10/2003 | Yamada et al. | |
| 2003/0219577 A1 | 11/2003 | Tait et al. | |
| 2003/0228715 A1 | 12/2003 | Brody et al. | |
| 2004/0018305 A1 | 1/2004 | Pagano et al. | |
| 2004/0118444 A1 | 6/2004 | Duggal et al. | |
| 2004/0135503 A1 | 7/2004 | Handa et al. | |
| 2004/0150328 A1 | 8/2004 | Czerw et al. | |

(Continued)

FOREIGN PATENT DOCUMENTS

EP 1416069 6/2004

(Continued)

*Primary Examiner* — Jessica L Ward
*Assistant Examiner* — Steven Ha
(74) *Attorney, Agent, or Firm* — Fish & Richardson P.C.

(57) ABSTRACT

The invention discloses for the first time how an organic component can be produced in a process designed entirely as a roll-to-roll process. The advantage of the continuous production method described here is, further, that the active regions of the active semiconductor layer are not exposed to unprotected solvents and/or solvent vapors at any time during the production process. This makes it possible to produce a high-quality organic component.

49 Claims, 6 Drawing Sheets

U.S. PATENT DOCUMENTS

| | | |
|---|---|---|
| 2004/0194821 A1 | 10/2004 | Chittibabu et al. |
| 2005/0008778 A1 | 1/2005 | Utsugi et al. |
| 2005/0016405 A1 | 1/2005 | Kuba et al. |
| 2005/0067006 A1 | 3/2005 | Eckert et al. |
| 2005/0106986 A1 | 5/2005 | Cok et al. |
| 2005/0164425 A1 | 7/2005 | Tuomikoski et al. |
| 2006/0152833 A1 * | 7/2006 | Halls et al. .................. 359/883 |

FOREIGN PATENT DOCUMENTS

| | | |
|---|---|---|
| JP | 60-173842 | 9/1985 |
| WO | WO 02/05361 | 1/2002 |

\* cited by examiner

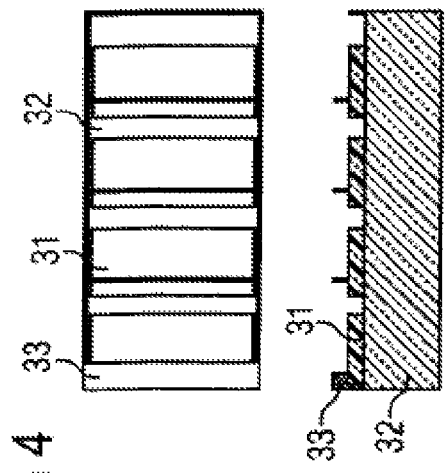
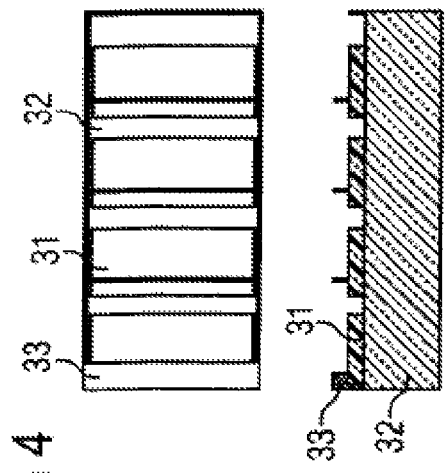
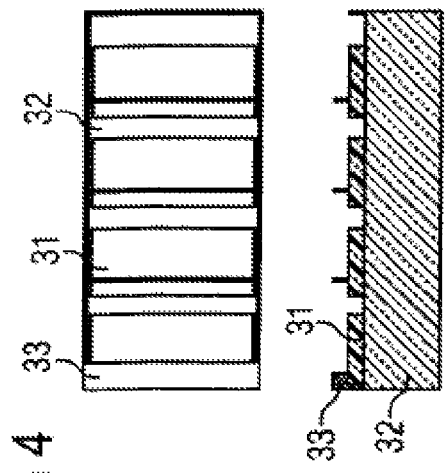
FIG 3
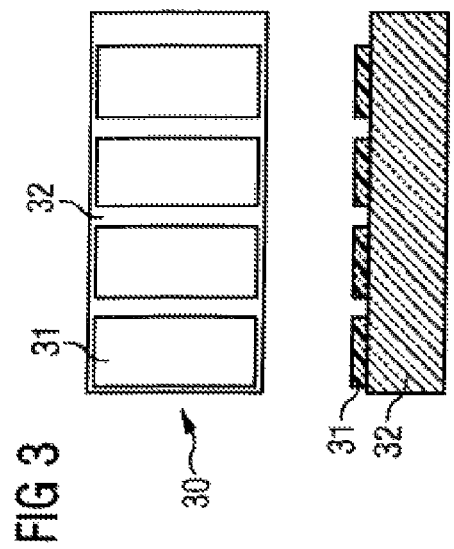
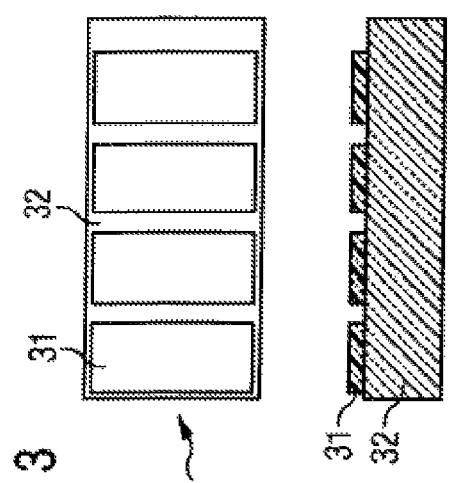
FIG 4
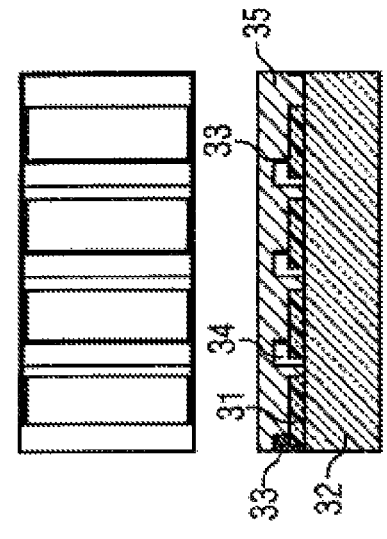
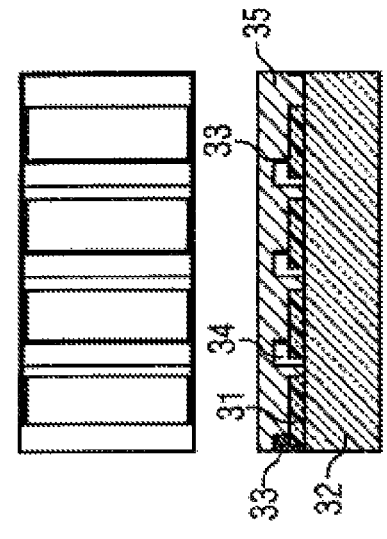
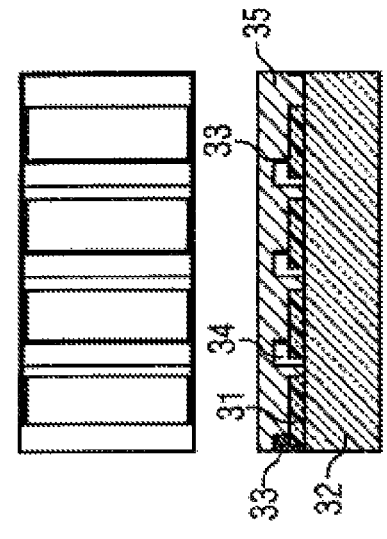
FIG 5
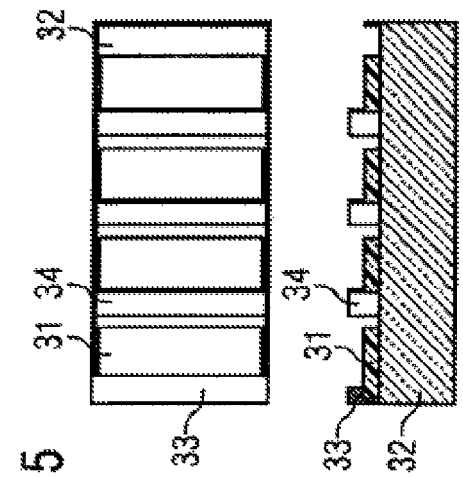
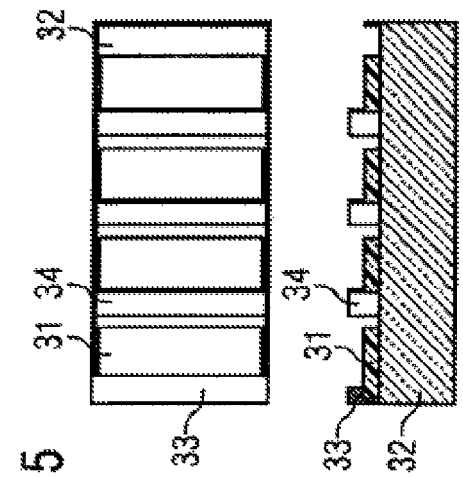
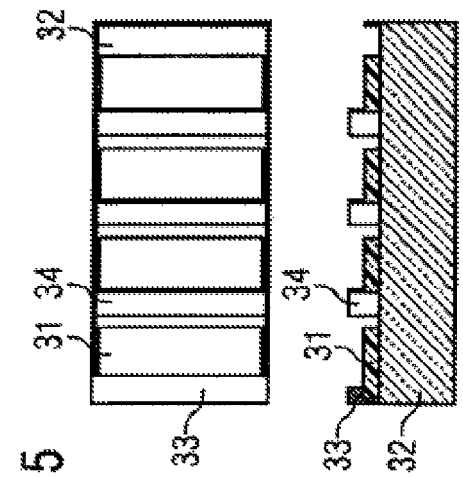
FIG 6

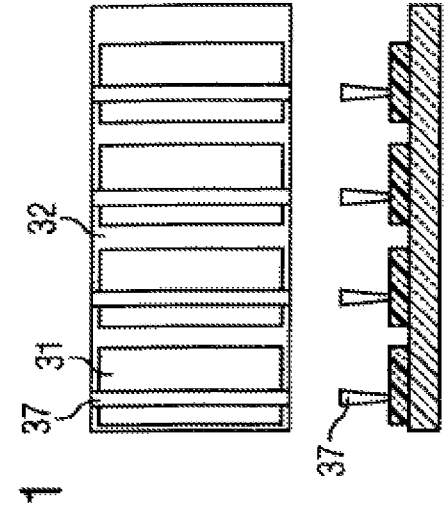
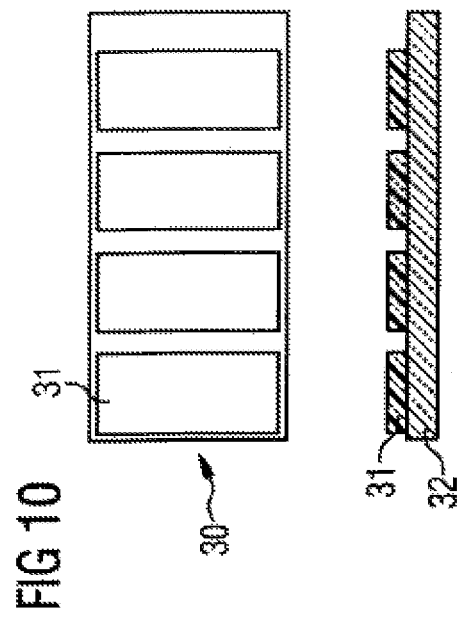
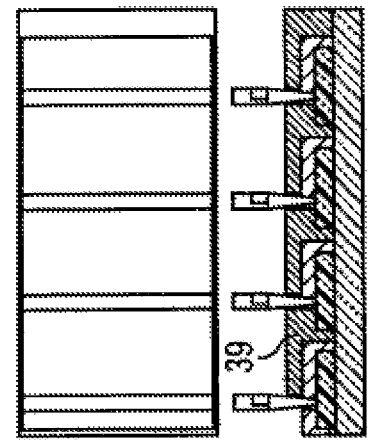
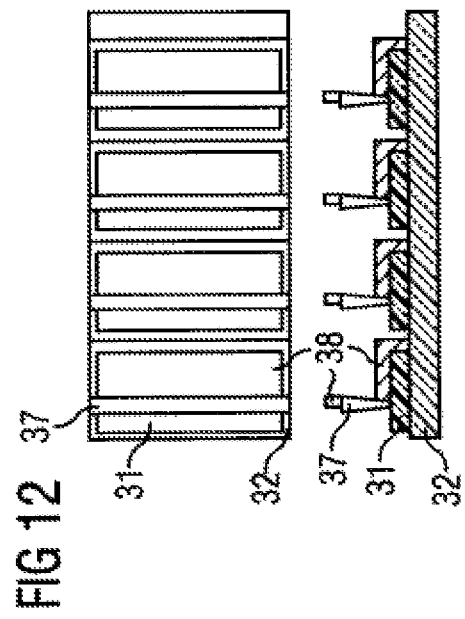

ROLL TO ROLL MANUFACTURING OF ORGANIC SOLAR MODULES

CROSS-REFERENCE TO RELATED APPLICATIONS

This application is a divisional application of and claims priority to U.S. application Ser. No. 11/127,439, filed on May 11, 2005, which claims priority under 35 U.S.C. §119 to German patent application serial number 10 2004 024 461.8, filed May 14, 2004, which is hereby incorporated by reference.

FIELD OF THE INVENTION

Apparatus and method for producing an electronic component comprising at least one active organic layer The invention concerns an apparatus and a method for producing an electronic component comprising at least one active organic layer, in which a foil is used as the substrate.

BACKGROUND OF THE INVENTION

Known are production methods for electronic components comprising at least one active organic layer in which one layer after the other is applied in consecutive individual method steps such as sputtering, spin coating or printing and is structured via structuring measures such as laser structuring or wet lithographic structuring.

A problem with this approach is that the layers are applied and structured in individual work steps, and between the work steps the finished layers must constantly be protected against solvents and/or mechanical damage. The production methods known heretofore thus are not suitable for mass production, and inferior-quality components often result since the individual layers of the component are damaged.

Organic electronic components are preferably Z-connected in the conventional manner, according to which, in a series connection, the top electrode of the first component is connected to the bottom electrode of the next component.

It has not been possible heretofore to produce the conventional Z-connection with organic electronic components in a way that is suitable for mass production.

BRIEF SUMMARY OF THE INVENTION

The object of the instant invention is, therefore, to make available an apparatus and a method by means of which organic photovoltaic and/or electrochromic components that are of high quality and/or possess the conventional Z-connection layout can be fabricated in a manner suitable for mass production.

The invention is directed to an apparatus for producing an organic electronic photovoltaic and/or electrochromic component comprising at least a first and a second roll and, between the two rolls, at least one row of three modules, said first roll comprising a strip of uncoated substrate, it being possible to apply and structure the optionally semitransparent bottom electrode by means of the first module in the row, which is disposed between the first roll and the second module in the row, at least one organic active layer by means of the second module in the row, and the counterelectrode by means of the third module in the row, the flexible organic component coated by means of the third module ultimately being able to be rolled up onto the second roll, which follows said module.

The invention is also directed to a method for the continuous roll-to-roll production of an organic component comprising at least one active organic layer, comprising at least the following steps:

a) a work step for applying and/or structuring the semitransparent bottom electrode, b) a work step for applying and/or structuring the organic semiconductor layer, c) a work step for applying and/or structuring the top counterelectrode.

In one embodiment, at least one further work step/one further module is provided by means of which at least one "sacrificial layer" can be applied to one of the bottom layers.

The term "sacrificial layer" is to be understood as an additional layer on the component, which layer, after further coating along with the layers disposed thereon, can be removed in such a way that the other layers incur no damage from the removal of the sacrificial layer. Materials that are suitable for a sacrificial layer are, for example, oils, waxes or the like, which can be removed for example thermally. "Sacrificial layer" can also, however, denote a layer of photoresist or a polymer film, which under some circumstances remains on the organic component or is removed in a very late work step.

In one embodiment of the method, the semitransparent bottom electrode is applied and/or structured by one or more of the following methods, for example:

i) sputtering with a shadow mask
ii) wet lithographic structuring and/or
iii) laser structuring of an electrode applied over a large area
iv) printing the electrode material
v) imprinting the substrate with an auxiliary layer prior to sputtering. The auxiliary layer can subsequently be removed or can remain on the component.

In one embodiment of the method, the organic semiconductive layer is applied and/or structured by one or more of the following methods:

i) structured application (e.g. printing) of the semiconductor material,
ii) preprinting of a sacrificial layer (e.g. oil), large-area coating of the semiconductor and subsequent removal of the sacrificial layer, the semiconductive layer being stripped off wherever the precursor was printed,
iii) large-area coating with subsequent structuring, for example by laser structuring.

In one embodiment of the method, the counterelectrode is applied and structured by one or more of the following methods:

i) production of a suitable sacrificial layer structure via wet lithography (can also take place prior to coating with, for example organic, semiconductor material), large-area vapor deposition of metal or another conductive material, removal of the sacrificial layer by means of, for example, exposure to UV light, a heating step and/or solvents ii) production of a suitable non-conductive structure via wet lithography (can also take place prior to coating with, for example organic, semiconductor material) or printing processes, which during the subsequent large-area vapor deposition of metal or another conductive material causes the vapor-deposited layer to be stripped off iii) printing of a sacrificial layer structure (can also take place prior to coating with the, for example organic, semiconductor material), large-area vapor deposition of metal or another conductive material, removal of the sacrificial layer by means of, for example, exposure to UV light, a heating step and/or solvents iv) printing of a non-conductive structure (can also take place prior to coating with the optionally organic semiconductor material), large-area low-angle vapor deposition of metal or another conductive material. The low-angle vapor deposition causes a tear in the metal layer that eliminates conduction by the layer.

v) Sputtering or vapor deposition of metal or another conductive material by means of a shadow mask vi) large-area vapor deposition with subsequent laser structuring of the metal or the conductive material.

In one embodiment, particularly associated with sensitive material, the organic component is also sealed and/or encapsulated.

The advantage of the here-described continuous production method is that all the process steps are suitable for a roll-to-roll process. Moreover, the active regions of the active semiconductor layer are not exposed to unprotected solvents and/or solvent vapors at any time during the production process. This is the only way that a high-quality organic component can be produced.

An organic electronic component is, for example, a photodetector, a solar cell, an electrochromic component, an OLED display, an electronic circuit, a sensor, such as, for example, a lab on a chip.

BRIEF DESCRIPTION OF THE FIGURES

The invention is described in further detail hereinafter on the basis of selected examples illustrated schematically in FIGS. 1 to 14.

FIGS. 3-9 show top and cross-sectional views of various process steps in making a device using two sacrificial layers;

FIGS. 10-13 show top and cross-sectional view of various process steps in making a device.

FIG. 1 is a graph showing the current path 6 through a series of Z-connected organic elements on a substrate 32. The current path 6 is shown in this cross section as a dashed line. It leads through the bottom element 31 of component 30.1, semiconductor 35 of the same component 30 and top electrode 36 to the bottom electrode 31 of the next component 30.2, therein through semiconductor 35 and top electrode 36 to the bottom electrode 31 of third component 30.3, and so on. The graph gives exemplary dimensions in which such a component can be produced.

FIG. 2 shows an embodiment of the continuous method as a roll-to-roll process (schematized).

Figure 1:
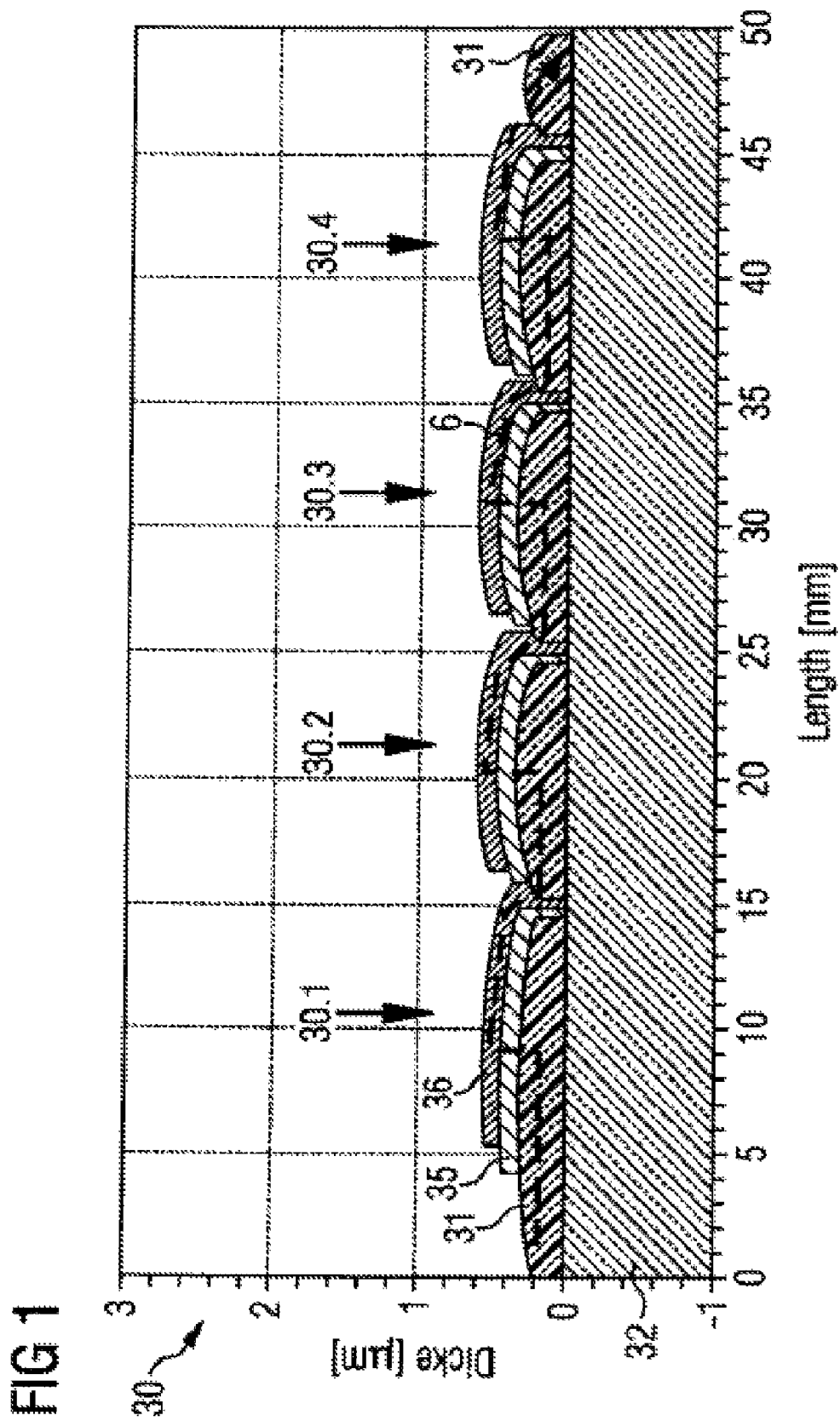
FIG. 1 is a cross-sectional view of a series Z-connected device.

At the upper left can be recognized the roll 11 on which the substrate 32, which is coated with the semitransparent bottom electrode 31, is rolled. The boundary between two process steps is symbolized by a transversely arranged bar. Process step 2.1 takes place before first crossbar 14 and serves to apply the bottom electrode over a large area. In process step 2.2, the structuring of semitransparent bottom electrode 31 takes place. The semitransparent bottom electrode is preferably an ITO (indium tin oxide) electrode. Process step 2.3 serves to apply semiconductor 35 over a large area. In process step 2.4, semiconductor 35, which is made for example from an organic material, is structured. Process step 2.4 is followed by 2.5, in which metal is vapor-deposited over a large area.

The figure shows relatively realistically how the structures of the lower layers continue to show through the thin film 35/36. The organic component is sealed via roll 15 and the sealed component is rolled up again in strip form onto roll 16.

Examples of how an organic component looks after each of various process steps are depicted in FIGS. 3 to 9, each of which shows the same organic component 30 at various stages of processing. The process takes place with the use of two sacrificial layers, layers 33 and 34.

FIG. 3 shows a plan view of and a cross section through an organic component 30. One can recognize substrate 32, which can for example be a foil, optionally further provided with a barrier layer (e.g. inorganic ceramics such as $Al_2O_3$, $SiO_2$, $SiN_3$ . . . , or inorganic/organic hybrid layers such as $Al_2O_3$/parylene/$Al_2O_3$, . . . ), and semitransparent bottom electrode 31. The barrier layer is between the substrate and the electrode. The barrier layer is unstructured.

FIG. 4 shows the organic electronic component from FIG. 3 after a further process step, after the production and structuring of first sacrificial layer 33, which can for example be an oil or a photoresist that will be removed in a subsequent process step. The production and structuring of the sacrificial layer can be performed by wet lithography or printing, for example.

FIG. 5 shows a further process step, the completion and structuring of second sacrificial layer 34. Second sacrificial layer 34 is so selected that it can be removed by a process that does not damage sacrificial layer 33 and the other layers of component 35. FIG. 6, finally, shows a further process step in which organic component 30 is coated over a large area with at least one active layer 35, for example the semiconductive layer of polythiophene/fullerene.

Figure 7:
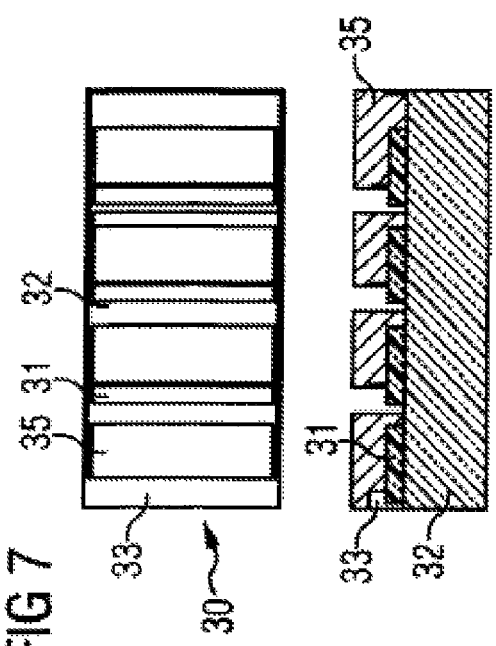

FIG. 7 shows organic component 30 after the removal of second sacrificial layer 34. Sacrificial layer 34 can be removed by evaporation, for example. Sacrificial layer 33 is still present on substrate 32 and bottom electrode 31; active layer 35 still covers portions of substrate 32 and all of bottom electrode 31 and first sacrificial layer 33.

Figure 8:
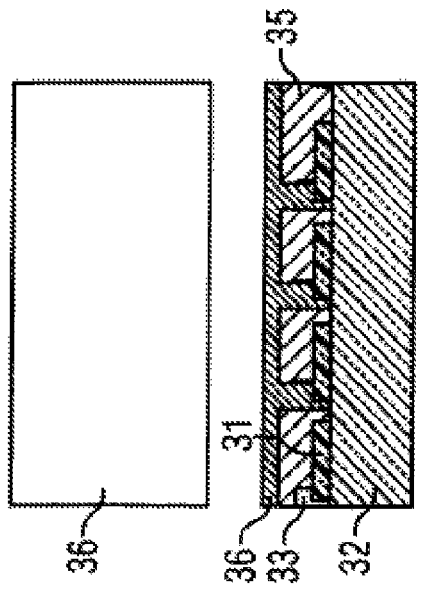

As illustrated in FIG. 8, component 30 is then coated over a large area with at least one conductive, for example metallic, layer 36. Metallic layer 36 can be composed, for example, of aluminum or of calcium/aluminum in two layers.

Figure 9:
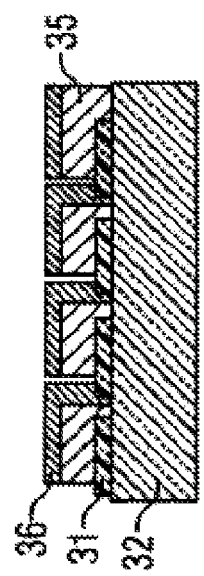

FIG. 9, finally, shows how component 30 looks after sacrificial layer 33 has been removed. The removal of the first sacrificial layer can be effected, for example, by UV exposure or in a solvent bath. Component 30 is in Z-connection, with only substrate 32, bottom electrode 31, semiconductive layer 35 and top electrode 36 to be seen. If the sensitivity of the material so requires, component 30 can now be coated with a protective layer.

FIGS. 10 to 13 show a further example of a production process, but with only one sacrificial or auxiliary layer.

FIG. 10 again shows substrate 32 with semitransparent bottom electrode 31. FIG. 11 shows how a structured auxiliary layer 37, for example a photoresist with sharp and/or negative edges, is applied for example by means of wet lithography or a printing step.

FIG. 12 shows how in a further process step, layer 38, composed of a polythiophene/fullerene mixture, is applied with a resolution of 5 mm, for example, to the at least one active layer, by structured printing or large-area coating and subsequent structuring by mechanical processes, laser structuring, or lithographic processes. The at least one active layer can be applied/deposited by means of one or more modules of the apparatus. These layers can be organic semiconductors, organic conductors, nanoparticles, inorganic semiconductor suspensions, small molecules, etc.

Finally, FIG. 13 shows how in spite of the large-area application of the at least one conductive, optionally metallic layer 39, portions of bottom electrode 31 are still exposed, since the film tears at the sharp or negative edges of auxiliary layer 37, thus leaving free spaces in the lower layers. After the process stage illustrated in FIG. 13, the finished component 30 can further be coated with a protective layer to seal it.

Figure 2:
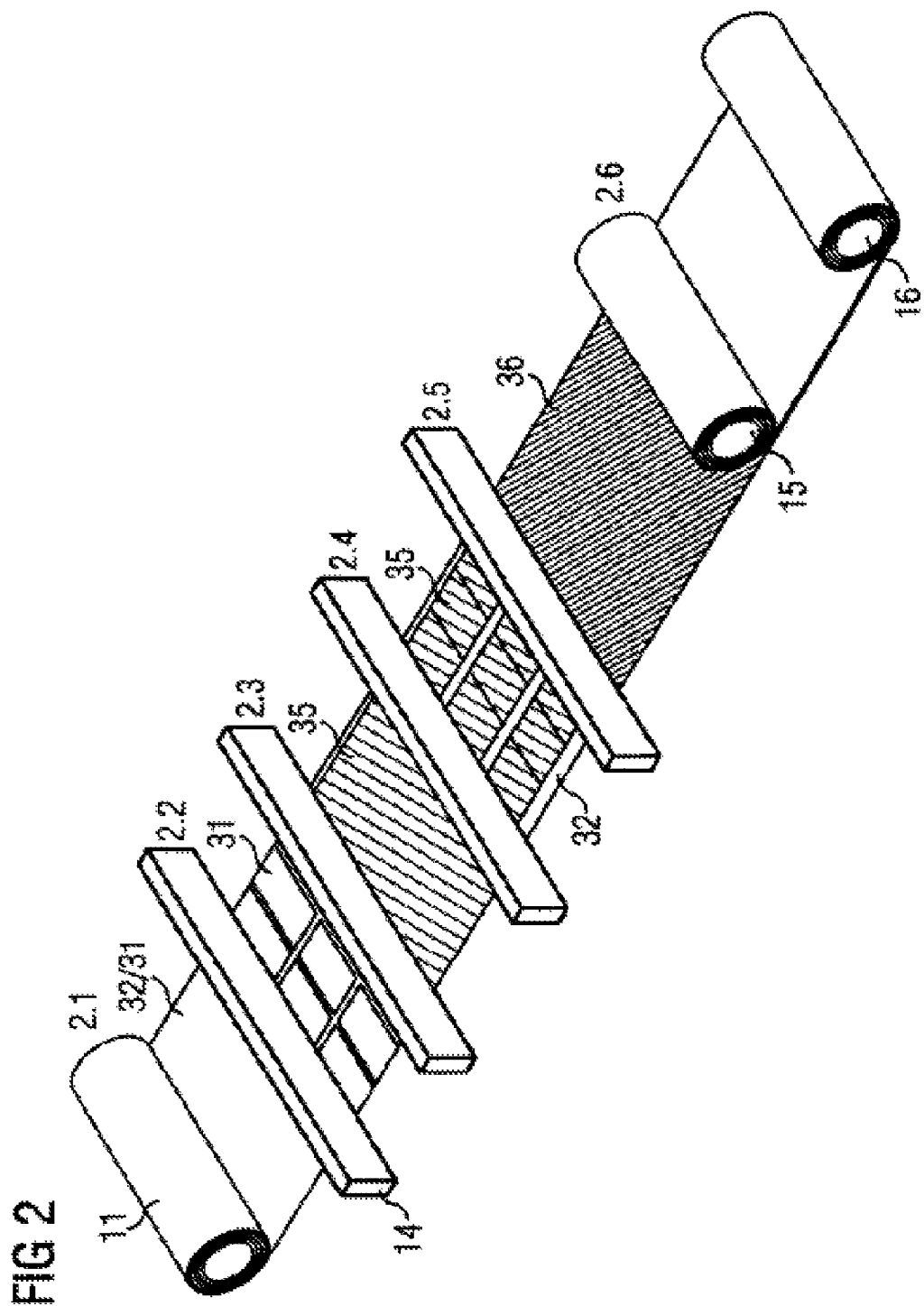
FIG. 2 is a schematic view of a system for a roll-to-roll process.
Figure 14:
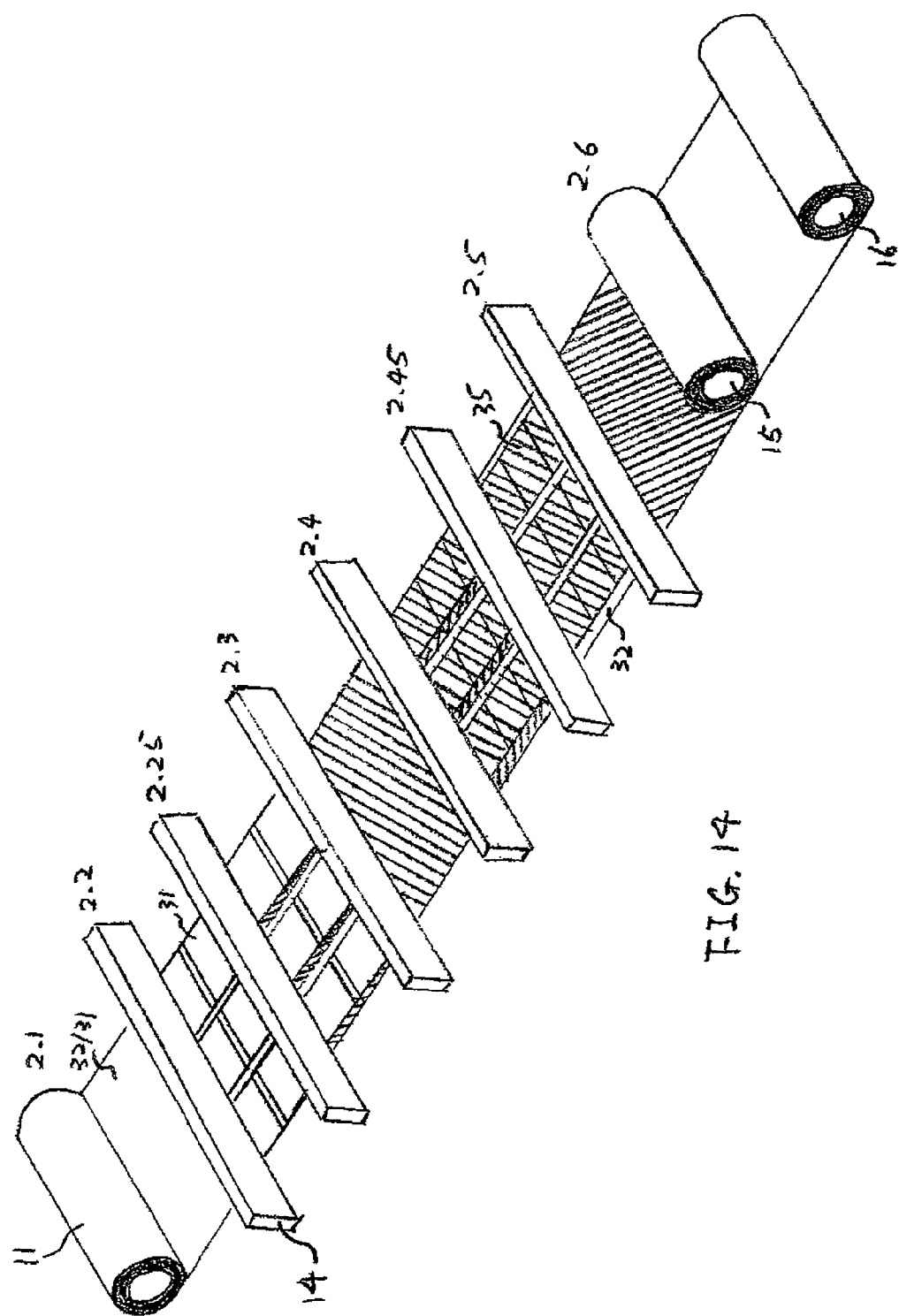
FIG. 14 shows a continuous roll-to-roll process using a sacrificial layer.

FIG. 14 shows an embodiment of a continuous roll-to-roll process using a sacrificial layer. The process is identical to that described in FIG. 2 except that it includes two additional process steps, i.e., step 2.25 and step 2.45. Step 2.25 takes place after bottom electrode 31 is structured and serves to apply a sacrificial layer onto structured bottom electrode 31. Step 2.45 takes place after semiconductor 35 is structured and serves to remove the sacrificial layer.

The invention discloses for the first time how an organic component can be fabricated in a process designed entirely as a roll-to-roll process. The advantage of the continuous production method described here is, further, that the active regions of the active semiconductor layer are not exposed to unprotected solvents and/or solvent vapors at any time during the production process. This makes it possible to produce a high-quality organic component.

What is claimed is:

1. A method, comprising:
   forming a first electrode supported by a substrate,
   forming a first sacrificial layer supported by the first electrode;
   forming an organic semiconductor material supported by the first sacrificial layer, the organic semiconductor material including first and second portions,
   removing the first sacrificial layer, thereby removing the first portion of the organic semiconductor material, and
   after removing the first sacrificial layer, forming a second electrode supported by the second portion of the organic semiconductor material, thereby providing an organic electronic component that comprises the substrate, the first electrode, the second portion of the organic semiconductor material and the second electrode,
   wherein:
      the second electrode does not contact the substrate, and
      the first electrode, the first sacrificial layer, the organic semiconductor material and the second electrode are formed via a roll-to-roll process.

2. The method as recited in claim 1, further comprising forming a second sacrificial layer supported by the substrate.

3. The method as recited in claim 2, wherein the second sacrificial layer is formed via the roll-to-roll process.

4. The method as recited in claim 2, further comprising a sealing step.

5. A method, comprising:
   forming a photovoltaic cell using a roll-to-roll process, the photovoltaic cell comprising an organic active layer, wherein the roll-to-roll process comprises:
      forming a first electrode supported by a substrate;
      forming first and second sacrificial layers, each of which being supported by at least one element selected from the group consisting of the first electrode and the substrate;
      forming an organic active material that is supported by the first and second sacrificial layers;
      after forming the organic active material, removing the first and second sacrificial layers, thereby removing portions of the organic active material to provide the organic active layer; and
      after removing at least one of the first and second sacrificial layers, forming a second electrode supported by the organic active layer, thereby providing a photovoltaic cell that comprises the substrate, the first electrode, the organic active layer, and the second electrode,
   wherein the second electrode does not contact the substrate.

6. The method of claim 5, wherein the organic active layer comprises a polymer.

7. The method of claim 6, wherein the polymer comprises polythiophene.

8. The method of claim 7, wherein the organic active layer comprises a fullerene.

9. The method of claim 6, wherein the organic active layer comprises a fullerene.

10. The method of claim 5, wherein the organic active layer comprises a fullerene.

11. A method, comprising:
   providing a first electrode supported by a substrate;
   forming a sacrificial layer supported by at least one element selected from the group consisting of the first electrode and the substrate;
   forming an organic semiconductor material supported by the sacrificial layer, the organic semiconductor material including first and second portions;
   removing the sacrificial layer, thereby removing the first portion of the organic semiconductor material;
   after removing the sacrificial layer, forming a second electrode supported by the second portion of the organic semiconductor material, thereby forming a photovoltaic cell that comprises the substrate, the first electrode, the second portion of the organic semiconductor material and the second electrode,
   wherein the method is a roll-to-roll process, and the second electrode does not contact the substrate.

12. The method of claim 11, wherein the sacrificial layer comprises one or more oils.

13. The method of claim 11, wherein the sacrificial layer comprises a wax.

14. The method of claim 11, wherein the sacrificial layer comprises a photoresist.

15. The method of claim 11, wherein the sacrificial layer comprises a polymer film.

16. The method of claim 11, wherein the method comprises forming at least two sacrificial layers during formation of the photovoltaic cell.

17. The method of claim 11, wherein the sacrificial layer is disposed on the substrate.

18. The method of claim 11, wherein the sacrificial layer is disposed on the first electrode.

19. The method of claim 11, wherein the method comprises disposing a first sacrificial layer on the substrate, and disposing a second sacrificial layer on the first electrode.

20. The method of claim 11, wherein the organic semiconductor material comprises a polymer.

21. The method of claim 20, wherein the polymer comprises polythiophene.

22. The method of claim 21, wherein the organic semiconductor material comprises a fullerene.

23. The method of claim 20, wherein the organic semiconductor material comprises a fullerene.

24. The method of claim 11, wherein the organic semiconductor material comprises a fullerene.

25. The method of claim 2, wherein a third portion of the organic semiconductor material is supported by the second sacrificial layer.

26. The method of claim 25, further comprising removing the second sacrificial layer, thereby removing the third portion of the organic semiconductor material.

27. The method of claim 26, wherein the second sacrificial layer is removed before the first sacrificial layer is removed.

28. The method of claim 27, wherein the first sacrificial layer is formed before the second sacrificial layer is formed.

29. The method of claim 28, wherein the first electrode comprises a plurality of discrete electrodes.

30. The method of claim 1, wherein the first electrode comprises a plurality of discrete electrodes.

31. The method of claim 2, wherein the first electrode comprises a plurality of discrete electrodes.

32. The method of claim 1, wherein the organic electronic component comprises a device selected from the group consisting of a photodetector, a solar cell, an electrochromic component, an OLED display, a sensor, and an electronic circuit.

33. The method of claim 1, wherein the organic electronic component comprises a solar cell.

34. The method of claim 2, wherein the organic electronic component comprises a device selected from the group consisting of a photodetector, a solar cell, an electrochromic component, an OLED display, a sensor, and an electronic circuit.

35. The method of claim 2, wherein the organic electronic component comprises a solar cell.

36. The method of claim 27, wherein the organic electronic component comprises a device selected from the group consisting of a photodetector, a solar cell, an electrochromic component, an OLED display, a sensor, and an electronic circuit.

37. The method of claim 27, wherein the organic electronic component comprises a solar cell.

38. A method, comprising:
providing a first electrode supported by a substrate,
forming a first sacrificial layer supported by the first electrode;
forming a second sacrificial layer supported by the substrate;
forming an organic semiconductor material supported by the first sacrificial layer, the organic semiconductor material including first, second and third portions,
removing the second sacrificial layer, thereby removing the third portion of the organic semiconductor material;
removing the first sacrificial layer, thereby removing the first portion of the organic semiconductor material, and after removing at least one of the first and second sacrificial layers, forming a second electrode supported by the second portion of the organic semiconductor material, thereby providing an organic electronic component that comprises the substrate, the first electrode, the second portion of the organic semiconductor material and the second electrode,
wherein the method comprises a roll-to-roll process, and the second electrode does not contact the substrate.

39. The method of claim 38, wherein the organic electronic component is selected from the group consisting of a photodetector, a solar cell, an electrochromic component, an OLED display, a sensor, and an electronic circuit.

40. The method of claim 38, wherein the organic electronic component is a solar cell.

41. The method of claim 38, wherein the organic semiconductor material comprises a polymer.

42. The method of claim 41, wherein the polymer comprises polythiophene.

43. The method of claim 42, wherein the organic semiconductor material comprises a fullerene.

44. The method of claim 40, wherein the organic semiconductor material comprises a fullerene.

45. The method of claim 38, wherein the organic semiconductor material comprises a fullerene.

46. The method of claim 30, wherein the second electrode comprises a plurality of discrete electrodes.

47. The method of claim 46, wherein the organic electronic component comprises a plurality of photovoltaic cells, each photovoltaic cell comprising a discrete electrode in the first electrode, the organic semiconductor material, and a discrete electrode in the second electrode, and the discrete electrode in the first electrode of a photovoltaic cell being electrically connected to the discrete electrode in the second electrode of a neighboring photovoltaic cell.

48. The method of claim 38, wherein the first electrode comprises a plurality of discrete electrodes and the second electrode comprises a plurality of discrete electrodes.

49. The method of claim 38, wherein the organic electronic component comprises a plurality of photovoltaic cells, each photovoltaic cell comprising a discrete electrode in the first electrode, the organic semiconductor material, and a discrete electrode in the second electrode, and the discrete electrode in the first electrode of a photovoltaic cell being electrically connected to the discrete electrode in the second electrode of a neighboring photovoltaic cell.

* * * * *